United States Patent [19]
Aruga et al.

[11] Patent Number: 5,456,757
[45] Date of Patent: Oct. 10, 1995

[54] SUSCEPTOR FOR VAPOR DEPOSITION

[75] Inventors: Michio Aruga, Chiba; Atsunobu Ohkuba, Yachimata; Akihiko Saito, Chiba; Katsumasa Anan, Narita, all of Japan

[73] Assignee: Applied Materials, Inc., Santa Clara, Calif.

[21] Appl. No.: 146,370

[22] Filed: Oct. 29, 1993

[30] Foreign Application Priority Data

May 27, 1993 [JP] Japan ................................ 5-126100

[51] Int. Cl.$^6$ ........................ C23C 16/50; H01L 21/00; H05H 1/00
[52] U.S. Cl. ...................... 118/723 E; 118/728; 156/345
[58] Field of Search ................................ 118/723 MW, 118/723 ME, 723 MR, 723 MA, 723 AN, 723 E, 723 ER, 723 I, 723 IR, 728; 156/345; 204/298.31

[56] References Cited

U.S. PATENT DOCUMENTS 5,201,990  4/1993  Chang et al. .
5,211,825  5/1993  Saito et al. ................. 118/723 MR X

FOREIGN PATENT DOCUMENTS 63-151024  6/1988  Japan .
2-42721    2/1990  Japan .

Primary Examiner—R. Bruce Breneman
Assistant Examiner—Jonathan D. Baskin
Attorney, Agent, or Firm—Randy W. Tung

[57] ABSTRACT

A novel susceptor used in a chemical vapor deposition device that is made of a ceramic material, specifically, an aluminum nitride material.

13 Claims, 2 Drawing Sheets

SUSCEPTOR FOR VAPOR DEPOSITION

FIELD OF THE INVENTION

The present invention generally relates to a novel susceptor that is used in a chemical vapor deposition (CVD) device and, more particularly, relates to a novel susceptor made of a ceramic material that is used in a plasma enhanced chemical vapor deposition device.

BACKGROUND OF THE INVENTION

Chemical vapor deposition devices have been used in the deposition of thin films on semiconductor substrates. In such a device, a gas containing the structural elements of the film material to be formed is first fed into a chamber, followed by heating the gas to induce a chemical reaction to deposit the desired film on a semiconductor substrate.

In a typical single-wafer CVD device, the platform that is used to hold the semiconductor substrate in place for the deposition process is called a susceptor. The susceptor is usually constructed of a thin plate for low mass and a surrounding rim for rigidity. At this time, the diameter of a susceptor in a typical reaction vessel is approximately 9" (228 mm) while the diameters of wafers being coated are normally 6" or 8" (152 or 203 mm). The susceptor can be made of graphite or aluminum coated with a silicon carbide coating so that it can be heated to the deposition temperature of the thin film without significant distortion. Still others have proposed methods of treating metal surfaces to improve their durability at high temperatures. For instance, U.S. Pat. No. 5,201,990 to Chang et al, assigned to the common assignee of the present invention, discloses a process for treating aluminum surfaces in a vacuum apparatus with a plasma consisting of a nitrogen-containing gas of either nitrogen or ammonia.

To select a suitable material for the susceptor used in a CVD device, the following criteria must be met. First, the thermal conductivity of the material must be sufficiently high such that any distortion in its dimensions and any deterioration in the material at the high operating temperatures of the CVD device is minimized. Secondly, when in-situ plasma chamber cleaning methods are utilized, the material used for the susceptor must be resistant to any corrosive effect of the plasma. Thirdly, the susceptor material must be of high purity in order to preclude contamination of the semiconductor substrait by impurities contained in the material.

As a consequence, metallic materials that are electrically conductive and that have high thermal conductivity are conventionally used for the susceptor. In particular, certain metal alloys of nickel such as Nonel™, Hastelloy™, etc., are frequently used for their resistance to fluorine-containing plasma which is one of the highly reactive plasmas often used in in-situ plasma chamber cleaning steps. Ceramic materials such as silicon carbide and graphite have also been used. In devices where the susceptor plate has to act as a high-frequency electrode, a conductive material such as metal must be used, When conventional materials such as Monel™, Hastelloy™, silicon carbide and graphite are used as the susceptor material, a protective coating layer is normally required to cover the surface of the susceptor and to protect it from the corrosive effect of the plasma.

When metallic materials are used in the susceptor, plastic deformations in the material occur in response to sudden changes in temperature. This leads to the problem of the protective film peeling off due to the difference in the values of coefficient of thermal expansion between the protective film and the metal material.

When ceramic materials are used in the susceptor, even though plastic deformation does not occur, the protective film still peels off the surface of the susceptor after a certain number of plasma cleaning processes. This may be because even small differences in the values of coefficients of thermal expansion between the protective film and the ceramic materials eventually have an effect after a number of process cycles. The protective layer itself may still be gradually eroded after many cleaning operations by the highly reactive plasmas and gases employed in such cleaning operations.

A susceptor made of such conventional materials therefore has problems in achieving both long term durability and reliability.

It is therefore an object of the present invention to provide a novel susceptor plate made of a suitable material that does not have the shortcomings of the prior art susceptor materials.

It is another object of the present invention to provide a novel susceptor plate made of a ceramic material that does not require a protective coating for achieving long term durability and reliability.

It is yet another object of the present invention to provide a novel susceptor plate made of an aluminum nitride material that does not require a protective coating when the susceptor plate is used in a CVD chamber.

It is a further object of the present invention to provide a novel susceptor assembly of high durability to include a susceptor plate made of an aluminum nitride material, an electrode plate installed under the susceptor plate, and an electrode cover member made of a ceramic material to enclose the electrode.

SUMMARY OF THE INVENTION

In accordance with the present invention, a novel susceptor plate made of aluminum nitride, and a novel susceptor assembly including a susceptor plate made of aluminum nitride, an electrode attached to the bottom surface of the susceptor plate, and an electrode cover made of a ceramic material mounted to the susceptor plate to enclose the electrode are provided.

In the preferred embodiment, aluminum nitride which has superior fluorine plasma resistance is used as the material for the susceptor plate. As a consequence, no corrosion or deformation of the susceptor plate is observed, nor are particulates formed, even when the plate is used at high temperatures within rigorous reactive plasma environments, particularly in cleaning operations. The superior thermal conductivity of aluminum nitride improves the uniformity of temperature over the surface of the susceptor which presents another processing advantage.

In the preferred embodiment, the susceptor assembly is used as a high-frequency electrode by attaching an electrode plate to the bottom surface of the susceptor plate. The electrode plate is covered by an electrode cover made of a ceramic material and demountably attached to the susceptor plate such that any adverse effect of the fluorine plasma is avoided.

BRIEF DESCRIPTION OF THE DRAWINGS

Other objects, features and advantages of the present invention will become apparent upon consideration of the specification and the appended drawings, in which.

DETAILED DESCRIPTION OF THE PREFERRED EMBODIMENT

Figure 1:
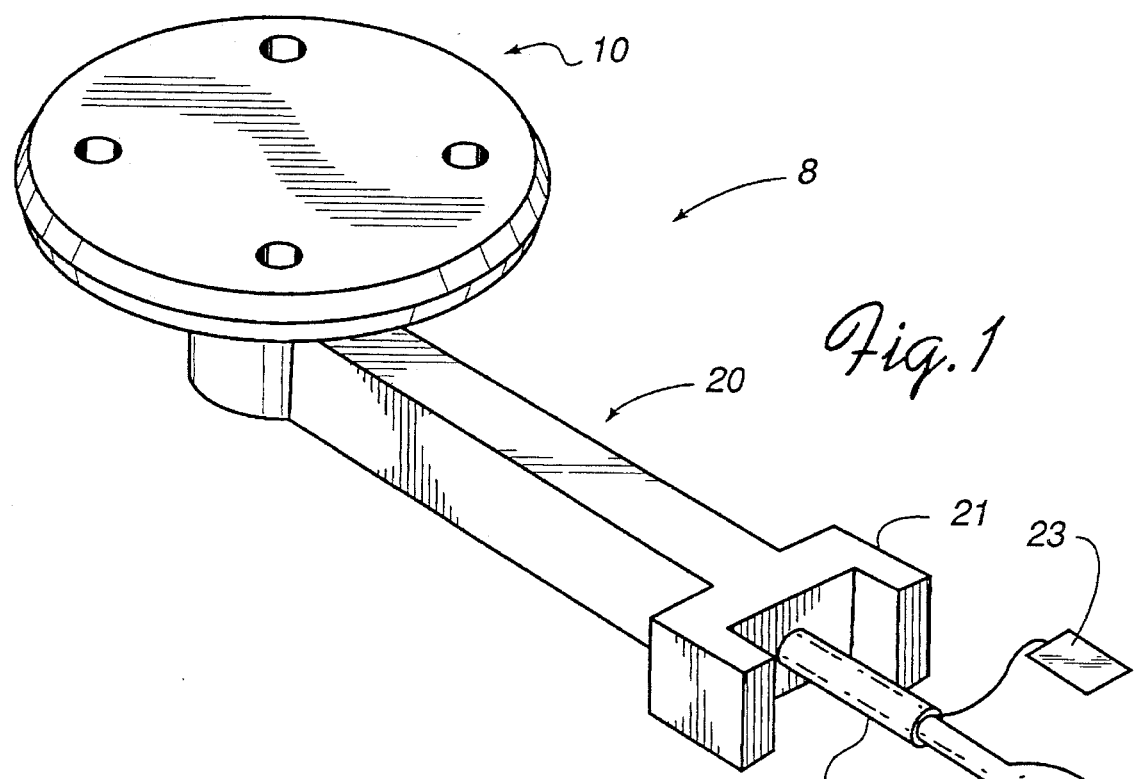
FIG. 1 is a perspective view of a susceptor assembly according to the present invention.
Figure 2:
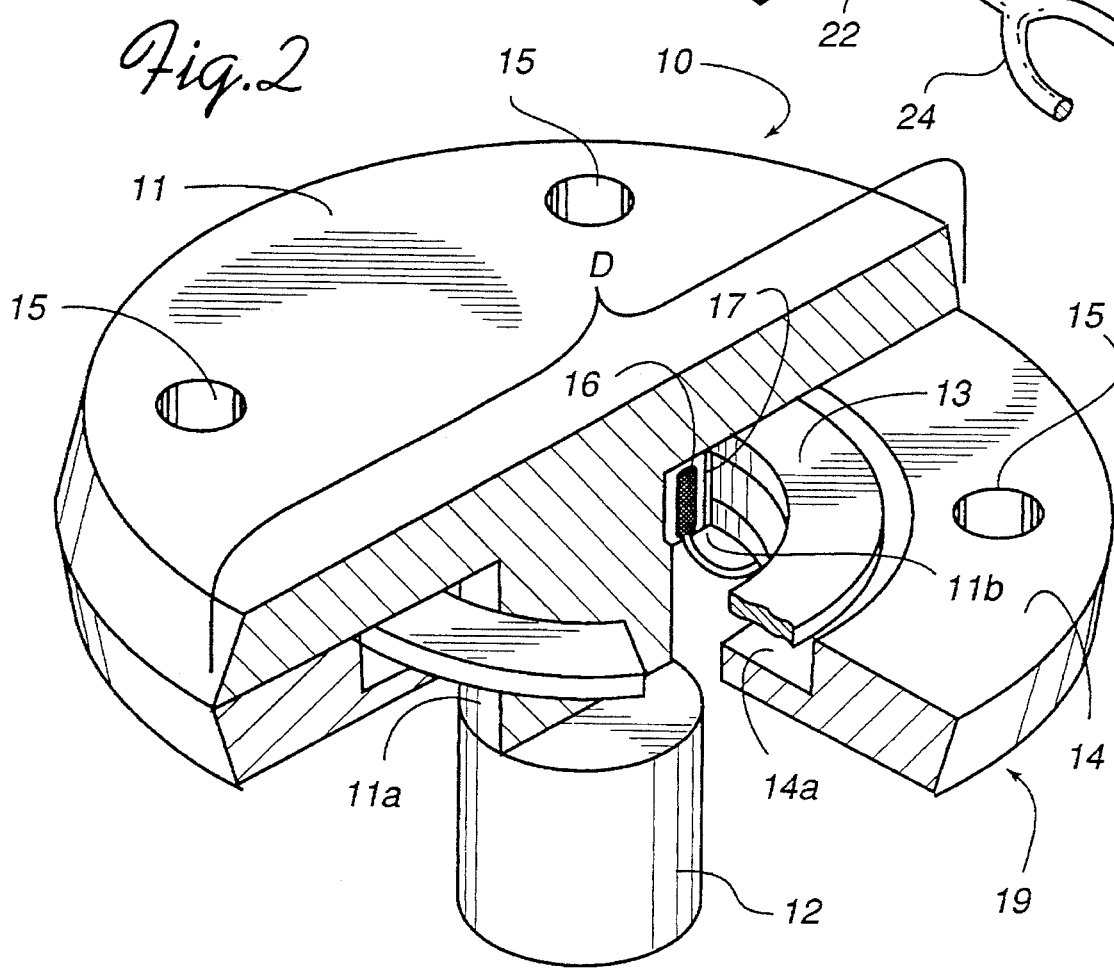
FIG. 2 is a partially sectioned and enlarged perspective view of a susceptor assembly according to the present invention.

Referring initially to FIG. 1, a susceptor device 8 according to the present invention is shown having a susceptor assembly 10 and a susceptor support arm 20. As shown in FIG. 2, the susceptor assembly 10 consists of a susceptor plate 11, a metallic electrode plate 13 affixed to the back surface of the susceptor plate 11. An electrode cover 19 is mounted to the back surface of susceptor plate 11 to cover the metallic electrode plate 13. FIG. 2 shows that susceptor plate 11 is a disc-shaped plate having a predetermined outer diameter D and a cylindrical hub 11a at the center. The susceptor plate 11 is made of aluminum nitride material. Aluminum nitride has been used as a semiconductor material in recent years primarily for its high thermal conductivity. It was only through the unique discovery of the present invention that aluminum nitride was found to have superior fluorine-plasma resistance.

In the manufacturing of aluminum nitride parts, it is customary to add yttrium or erbium into the mix as a mold release agent. However, it is believed that yttrium may have some adverse effect on the wafer properties. High purity aluminum nitride with a minimum amount of impurities such as yttrium is therefore preferred.

As shown in FIG. 2, a high-frequency RF contact post 12 is affixed to the hub 11a of the susceptor plate 11. The metallic electrode plate 13 is a ring-shaped member. The electrode cover 19 is a disc-shaped member having a center hollowed-out section 14a on surface 14 facing the susceptor plate 10 adapted to accept the electrode plate 13. Alumina is frequently the material used for the electrode cover 19.

Holes 15 are provided and aligned in the electrode cover 19 and the susceptor plate 11. A number of rods (not shown) are positioned in holes 15 for elevating and lowering a wafer situated on susceptor plate 11 during processing.

FIG. 2 also shows a thermocouple mounting post 11b which is attached to hub 11a adapted to accept a thermocouple 16. Thermocouple 16 is fixed to mounting post 11b by metallic member 17 in the following manner. First, a tapped hole (not shown) is provided for mounting post 11b by perforating the susceptor plate 11. A threaded hollow cylindrical metallic member 17 is then provided to engage with the tapped hole. In the hollow part of the metallic member 17, a second tapped hole (not shown) is drilled. A threaded thermocouple 16 is then engaged in the second tapped hole. The metallic member 17 is preferably made of nickel which has a superior thermal conductivity.

It should be noted that thermocouple 16 is preferably not inserted directly into susceptor plate 11, but instead is inserted into the metallic member 17 in order to avoid any potential cracking problems of the ceramic susceptor plate 11. This provides a significant processing advantage when thermocouple 16 is repeatedly inserted into and removed from the susceptor plate 11 when service or exchange of the thermocouple 16 is necessary.

The RF contact post 12 and the metallic electrode plate 13 are connected by wiring which is not shown in FIG. 2. As shown in FIG. 1, the distant end of the susceptor support arm 20 has a cylindrical shape with a bottom surface and attached on the near end is a U-shaped connector 21 for mounting to a CVD body. Insulator tube 22 passes through the interior of the susceptor support arm 20 while lead 23 for thermocouple 16 and lead 24 for RF electrode plate 13 pass through the inside of tube 22.

Figure 3:
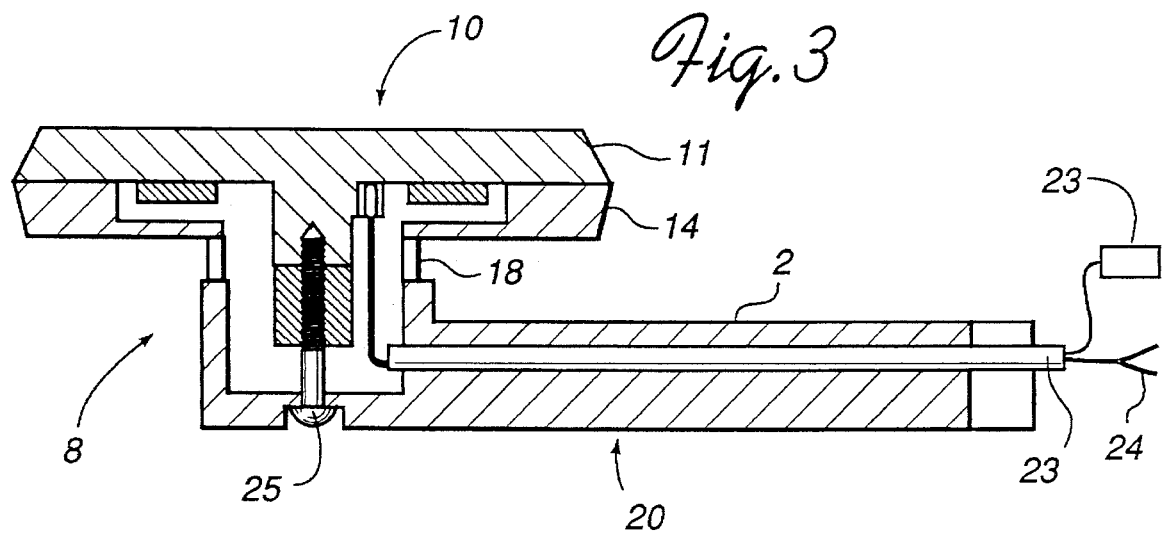
FIG. 3 is an enlarged cross-sectional view of the susceptor assembly.

The susceptor assembly 10 and the susceptor support arm 20 are connected together by bolt 25 as shown in FIG. 3. Collar 18 is provided at the junction of 10 and 20 to enable an air tightness inside the susceptor assembly.

Figure 4:
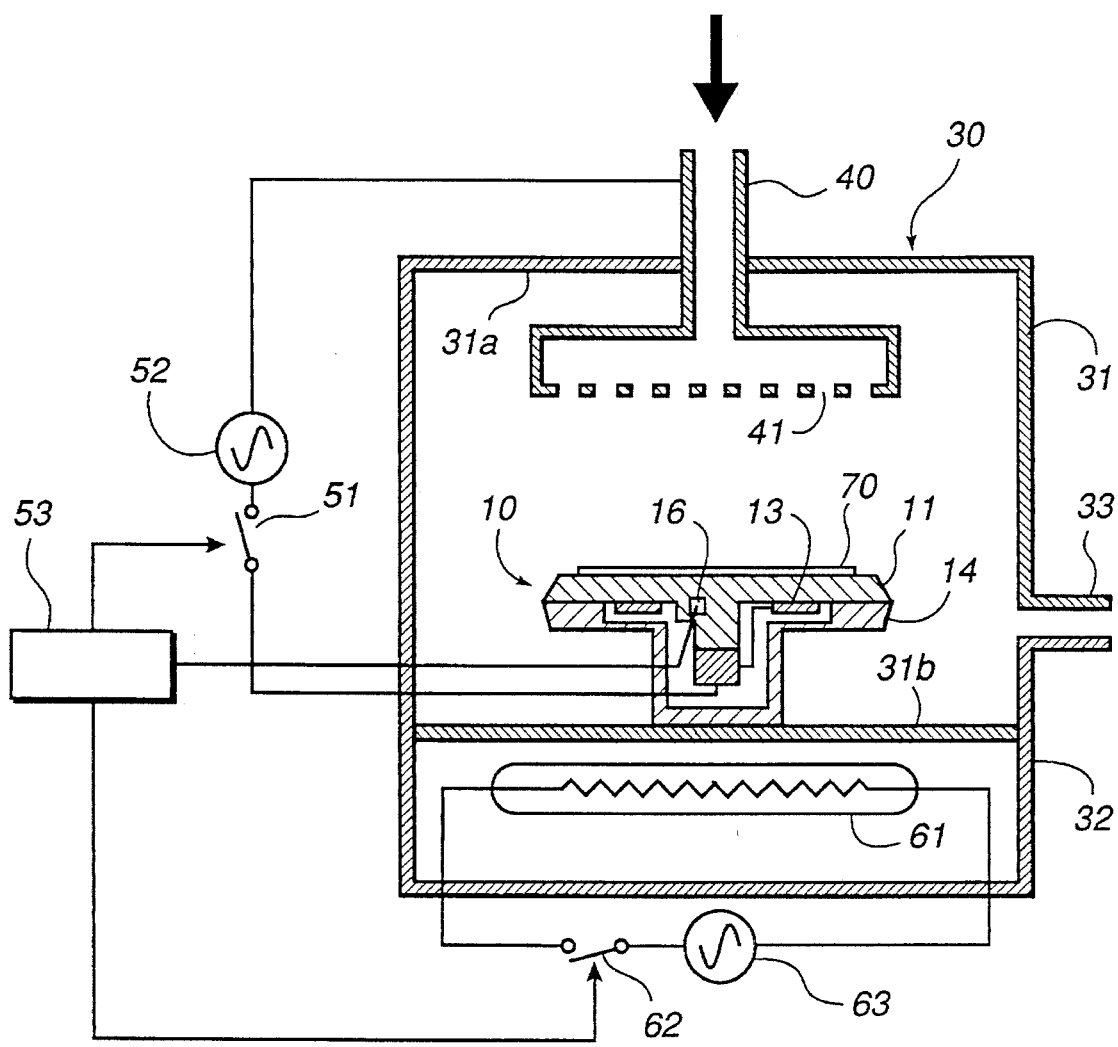
FIG. 4 is a cross-sectional view of a CVD device which has a susceptor assembly installed therein.

FIG. 4 shows a susceptor assembly 10 mounted in a CVD device. Reaction chamber 30 consists of a main compartment 31 and a heat lamp compartment 32. Susceptor assembly 10 is mounted on floor 31b of reaction chamber 31. A reaction gas inlet 40 is mounted on top 31a of reaction chamber 31. The gas spray port 41 of the reaction gas inlet 40 and the susceptor plate 11 of the susceptor assembly 10 are positioned facing each other. The reaction gas inlet 40 also serves as the RF electrode and is in a paired relationship with the metallic electrode plate 13 in the susceptor assembly 10. The RF electrode 40 and metallic electrode plate 13 are connected to a high-frequency power source 52 through a control switch 51. The thermocouple 16 positioned in the susceptor assembly 10 is connected to controller 53 such that the output signals from thermocouple 16 are fed into controller 53. A gas exhaust port 33 is provided in the sidewall of reaction chamber 31.

As shown in FIG. 4, a heat lamp 61 is positioned in the heat lamp compartment 32. It is connected to an alternating-current power source 63 through a control switch 62. A floor 31b is provided between the main compartment 31 and the heat lamp compartment 32 for mounting of the susceptor assembly 10. It is positioned such that heat emitted from heat lamp 61 radiates to susceptor plate 11. To facilitate the heat radiation, sections of quartz glass are inserted into the metallic plate which composes floor 31b.

Controller 53 controls the output of heat lamp 61 by the data feedback from thermocouple 16 and the control of the alternating-current power source 63.

The susceptor plate 11 is made of aluminum nitride. Since aluminum nitride and aluminum have the same thermal conductivity, the temperature uniformity achieved on the surface of an aluminum nitride susceptor plate is nearly the same as that achieved on the surface of an aluminum susceptor plate.

The following is a process description for forming a $SiO_2$ film on a semiconductor substrate using the present invention.

As seen in FIG. 4, to begin the process, switch 62 of heat lamp 61 is first turned on. The temperature of the susceptor plate 11 is increased to over 500° C. by the radiant heat from heat lamp 61. A semiconductor substrate 70 is then placed on the susceptor plate 11. TEOS (tetra-ethoxy-ortho-silicate) which is the primary reaction gas for $SiO_2$ is introduced through the reaction gas inlet 40 into reaction chamber 30. A mixture of TEOS and an oxidizer is sprayed onto the semiconductor substrate 70. During the flow of the reaction gas, semiconductor substrate 70 is heated for a predetermined period of time. A $SiO_2$ film is thus formed on the semiconductor substrate 70.

The same susceptor assembly can be used to form refractory metal films such as tungsten, etc. using appropriate reactive gases.

It is necessary to periodically clean the interior of the reaction chamber 30 since SiO$_2$ is deposited non-discriminatorily on all surfaces inside the reaction chamber 30. A method of cleaning will now be illustrated.

To start the cleaning process, a fluorine-containing gas is first introduced through the reaction gas inlet 40 into the reaction chamber 30. Along with the introduction of the fluorine-containing gas, control switch 51 is turned on and a voltage is applied to the reaction gas inlet 40 and the metallic electrode plate 13 positioned in the susceptor assembly 10. This ignites a fluorine-containing plasma inside the reaction chamber 30. The plasma etches the SiO$_2$ film and cleans it off the interior surfaces of reaction chamber 30.

When the susceptor plate made of aluminum nitride of the present invention is used, the superior resistance of aluminum nitride to fluorine plasma prevents any generation of particulates from or corrosion of the susceptor plate even after prolonged period of use. There is no abrasion of the susceptor plate and therefore it is not necessary to cover the surface with a protective coating. The present invention therefore provides a novel susceptor plate that has superior reliability and durability.

Another benefit made possible by the present invention is that the metallic electrode plate 13 which is mounted to the bottom surface of the susceptor plate 11 is protected by a ceramic electrode cover mounted to the susceptor plate 11. The metallic electrode plate 13 is shielded from the plasma and consequently, is shielded from attack by the plasma.

Furthermore, the CVD chamber illustrated above can also be used in a plasma enhanced CVD process. A plasma enhanced CVD process can be carried out by using the reaction gas inlet 40 as a plasma electrode and the metallic electrode plate 13 as the other plasma electrode. The susceptor assembly illustrated in the present invention can also be used in other CVD devices that do not use lamp heating, for instance, it can be used in devices that utilize induction heating.

The present invention provides a durable and reliable CVD device by utilizing a susceptor plate made of aluminum nitride material. By using aluminum nitride, there is no generation of particulates from or corrosion of the susceptor plate. Moreover, there is no abrasion on the susceptor plate after prolonged usage and thus no need to cover the surface of the susceptor plate with a protective film.

While the present invention has been described in an illustrative manner, it should be understood that the terminology used is intended to be in the nature of words of description rather than of limitation.

Furthermore, while the present invention has been described in terms of a preferred embodiment thereof, it is to be appreciated that those skilled in the art will readily apply these teachings to other possible variations of the invention.

We claim:

1. A susceptor plate for supporting a substrate in a deposition chamber comprising aluminum nitride, said plate being situated between an electrode and a reaction area.

2. A susceptor plate according to claim 1, wherein said deposition chamber is a chemical vapor deposition chamber or a plasma enhanced chemical vapor deposition chamber.

3. In a deposition chamber, the combination comprising:

a susceptor plate having a top surface, a bottom surface and a diameter for supporting a substrate, said susceptor plate comprising aluminum nitride;

an electrode plate having an outside diameter positioned juxtaposed to the bottom surface of said susceptor plate; and an electrode cover having an external diameter larger than the outside diameter of the electrode plate such that when it is mounted to the bottom surface of said susceptor plate it forms a cavity adapted to receive and shield said electrode plate.

4. The combination of claim 3, which further includes gas injectors for introducing a cleaning gas into the chamber, said cleaning gas including highly reactive species.

5. The combination of claim 4, wherein said electrode plate is adapted to be energized by a voltage suitable for ionizing said gas to establish a plasma within the deposition chamber.

6. The combination of claim 5, in which said plasma is a fluorine-bearing plasma.

7. A susceptor assembly according to claim 3, wherein said electrode cover is made of a ceramic material.

8. A susceptor assembly according to claim 3, wherein said external diameter of said electrode cover is substantially the same as said diameter of the susceptor plate.

9. A susceptor assembly according to claim 3, wherein said deposition chamber is a chemical vapor deposition chamber or a plasma enhanced chemical vapor deposition chamber.

10. In a plasma processing chamber for depositing materials upon substrates, the apparatus comprising:

means for introducing a cleaning gas into the chamber, said gas including highly reactive components;

electrode means for applying voltage to ionize the gas into a plasma;

a member for supporting a substrate within said chamber, said member being comprised of aluminum nitride, said aluminum nitride being situated between the electrode means and a reaction area.

11. The apparatus of claim 10, in which said member for supporting a substrate also is an electrode.

12. The apparatus of claim 10, which also includes means for introducing a process gas to support a deposition process upon a surface of a substrate.

13. The apparatus of claim 10, wherein said cleaning gas includes a fluorine component.

* * * * *